United States Patent
Chan et al.

(10) Patent No.: US 6,990,038 B1
(45) Date of Patent: Jan. 24, 2006

(54) CLOCK DRIVER AND BOUNDARY LATCH FOR A MULTI-PORT SRAM

(75) Inventors: Yuen H. Chan, Poughkeepsie, NY (US); Timothy J. Charest, West Hurley, NY (US); Rajiv V. Joshi, Yorktown Heights, NY (US); Rolf Sautter, Bondorf (DE)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 11/056,803

(22) Filed: Feb. 11, 2005

(51) Int. Cl.
*G11C 8/00* (2006.01)

(52) U.S. Cl. .......................... 365/230.05; 365/230.06; 365/233

(58) Field of Classification Search ........... 365/230.05, 365/230.06, 233
See application file for complete search history.

(56) References Cited

U.S. PATENT DOCUMENTS

| 4,573,119 | A | * | 2/1986 | Westheimer et al. ......... 713/190 |
| 6,029,235 | A | * | 2/2000 | Morgan ...................... 711/169 |
| 6,134,639 | A | * | 10/2000 | Morgan ...................... 711/169 |
| 6,643,807 | B1 | * | 11/2003 | Heaslip et al. .............. 714/719 |

* cited by examiner

*Primary Examiner*—Son T. Dinh
(74) *Attorney, Agent, or Firm*—Law Office of Charles W. Peterson, Jr.; Satheesh K. Karra, Esq.

(57) ABSTRACT

A multi-port (e.g., two port) CMOS static random access memory (SRAM) with a local clock driver generating clocks for boundary latches. Local clocks select between address inputs clocked into the boundary latches. A read clock selects and latches a read address in the boundary latches. A second clock latches write addresses and, when appropriate, test data addresses.

28 Claims, 4 Drawing Sheets

| SMT | SMC | SELB | C1A | C1B | |
|---|---|---|---|---|---|
| 1 | 0 | 0 | 1 | 0 | (SYS READ) |
| 1 | 0 | 1 | 0 | 1 | (SYS WRITE) |
| 0 | 1 | X | 0 | 1 | (ABIST R/W) |
| 0 | 1 | X | 0 | 1 | (ABIST R/W) |
| 0 | 0 | X | 0 | 0 | (LBIST-CMB) |
| 1 | 1 | X | u | u | (NOT ALLOWED) |

US 6,990,038 B1

CLOCK DRIVER AND BOUNDARY LATCH FOR A MULTI-PORT SRAM

FIELD OF THE INVENTION

The present invention is related to integrated circuit (IC) memory and, more particularly to selecting and accessing data stored in multi-port static random access memory (SRAM) arrays.

BACKGROUND DESCRIPTION

High performance Integrated Circuit (IC) chips are typically very complex with very powerful logic functions. Typical such high performance ICs, commonly include on-chip memory for local storage, e.g., a static random access memory (SRAM) macro. Multi-port SRAMs may be used for pipeline registers, for example. Also, for reliable operation, the typical high performance IC includes some form of Built In Self Test (BIST) as well. Thus, very often an SRAM macro must be designed for multimode operation, capable of transferring data to/from the SRAM macro depending upon the current operating mode, e.g., normal system operation, Array BIST (ABIST) operation, Logic BIST (LBIST) operation and etc. A typical SRAM macro, as with any typical storage, has very critical internal (to the SRAM macro) timing constraints that, if violated, cause array failures. These failures may be very difficult to isolate and identify, whether tested using BIST or otherwise. Typically, to contain, control and thus, minimize this criticality/sensitivity, SRAM macros include locally clocked boundary latches at inputs and outputs, e.g., dual port latches latching read/write addresses for decoding word lines or bit lines and etc. It is important to correctly latch SRAM macro boundary input/output (I/O) states race free, i.e., to correctly latch the current input/output address and to avoid latching/driving portions of addresses from two sequential accesses, e.g., where a read address is presented during a read.

However, circuits designed for multimode operation must interface with adjacent logic differently, depending upon the current operating mode. For example multi-mode circuits must be capable of receiving test patterns with wide timing margins during BIST, and, otherwise, receiving logic signals designed to squeeze every bit of performance out of the particular data path. So, unfortunately, multimode operation exacerbates SRAM design criticality/sensitivity, particularly, in switching between operating modes and because the particular operation mode determines how each (I/O) signal passes to/from the SRAM macro. This all further complicates I/O latch timing, e.g., crucial address arrival times as well as clock arrival times.

Thus, there is a need for SRAM macro clocking logic that maintains intra macro timing regardless of operating mode.

SUMMARY OF THE INVENTION

It is a purpose of the invention to improve multi-port SRAM timing reliability;
It is another purpose of the invention to improve multi-port SRAM multimode operation;
It is another purpose of the invention to improve multi-port SRAM timing reliability independent of operating mode.

The present invention relates to a multi-port (e.g., two port) CMOS static random access memory (SRAM) with a local clock driver generating clocks for boundary latches. Local clocks select between address inputs clocked into the boundary latches. A read clock selects and latches a read address in the boundary latches. A second clock latches write addresses and, when appropriate, test data addresses.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figures 1, 2B:
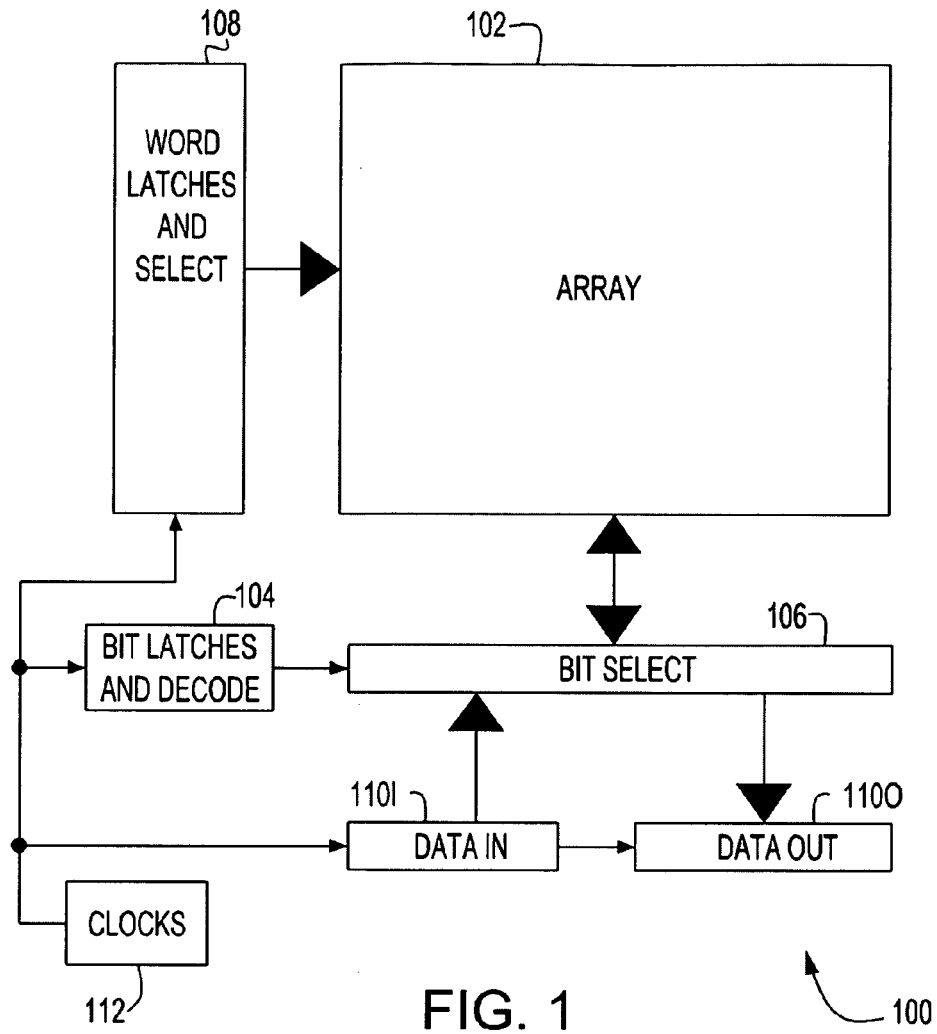
FIG. 1 shows a block diagram example of a multi-port memory, e.g., a two port static random access memory (SRAM macro or chip), with boundary latches clocked by preferred embodiment clocks.
FIG. 2B shows a truth table for the multimode clock.

Turning now to the drawings and, more particularly, FIG. 1 shows a block diagram example of a multi-port memory, e.g., a two port static random access memory (SRAM) 100 (macro or chip) with boundary latches clocked by preferred embodiment clocks. Preferably, the SRAM is in a standard insulated gate field effect transistor (FET) technology. More particularly, the SRAM is in the complementary FET technology that is commonly referred to as CMOS.

Cells (not shown) of an array 102 are selected by coincidence of a column cells with a row, i.e., a word line selecting a row of cells. Boundary latches in bit address decode 104 latch a bit address that is passed to bit select circuit 106 to select a column in the array 102. Similarly, boundary latches in word decoder 108 latch a word address that drives a word line to select a row in the array. Data passes in through input buffers 110I to the bit select circuit 106 during a write; and, out through output buffers 110O from the bit select circuit 106 during a read. Preferred clock logic 112 provides local timing (e.g., to synchronize the SRAM 100 to other chip circuits) independent of chip operating mode. Thus, both a read address and a write address may be provided to the preferred boundary latches, coincidentally, with selection of which address is currently latched being selected primarily by the particular local clock gating the boundary latch as provided by clock logic 112.

Figure 2A:
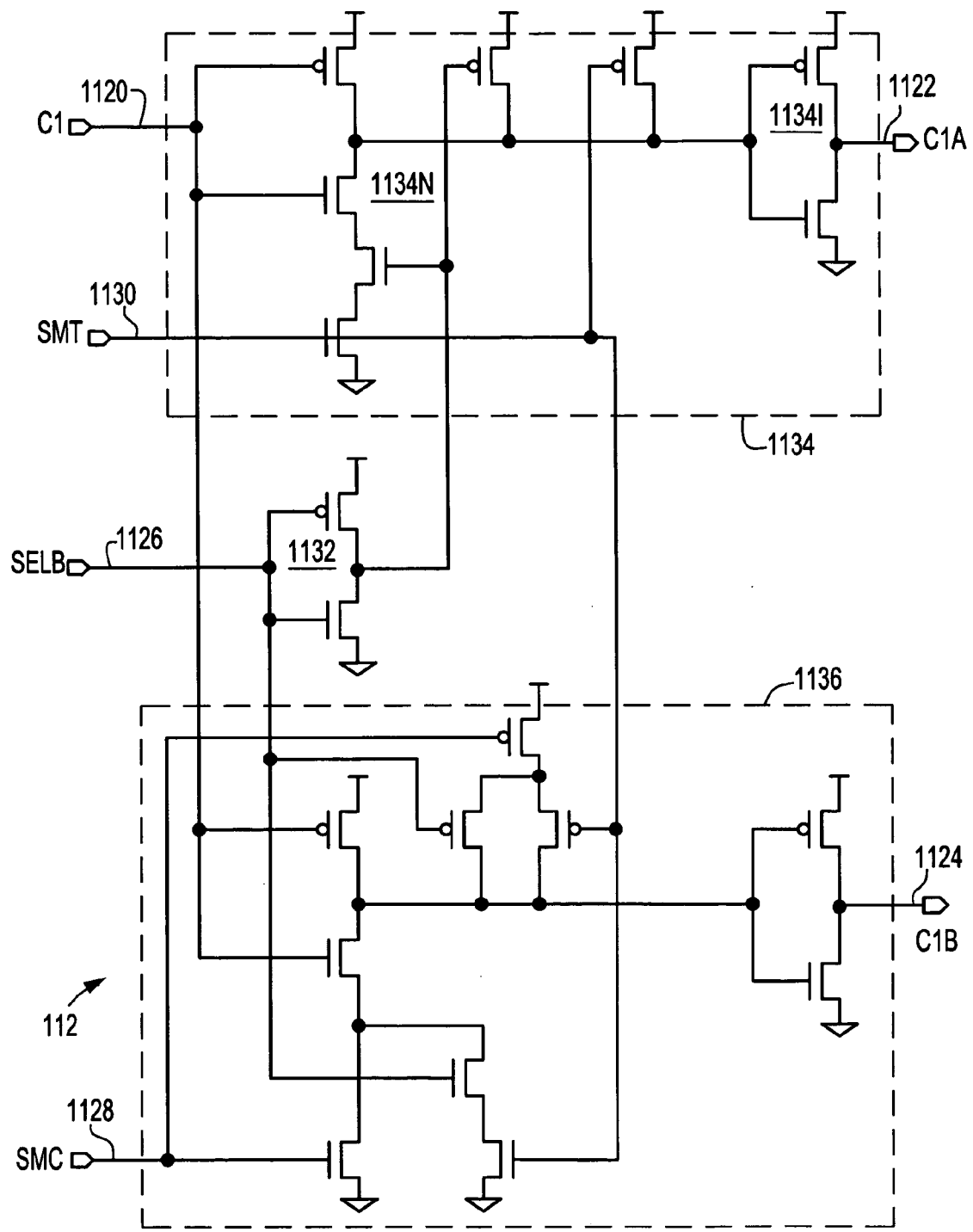
FIG. 2A shows an example of a preferred embodiment multimode clock selector.

FIG. 2A shows an example of a preferred embodiment clock logic (e.g., 112 in FIG. 1), which is a multimode clock selector or driver; FIG. 2B shows a truth table for the preferred multimode clock selector 112 of FIG. 2A. The multimode clock selector 112 receives a global clock (C1) 1120 and selectively provides a pair of local clocks (C1A, C1B) 1122, 1124. The local clocks 1122, 1124 are selected by a read/write select (SELB) 1126 and a pair of complementary operating mode selects (SMC, SMT) 1128, 1130. An inverter 1132 inverts read/write select 1126. Three way AND gate 1134 combines the inverted read/write output of inverter 1132 with the global clock 1120 and the uncomplemented operating mode or system mode select 1130 to generate a normal operating mode read address clock 1122. In this example, AND gate 1134 includes a NAND gate 1134N and an inverter 1134I inverting the output of NAND gate 1134N. An AND-OR 1136 combines the global clock 1120 with the complemented operating mode or ABIST mode select 1128 or the read/write select 1126 and the system mode select 1130 to generate the other test mode local address clock 1124. In this example AND-OR 1136 includes an AND-OR-Invert 1136N and inverter 1136I. The AND-OR-Invert 1136N ORs the ABIST mode select 1128 with the NANDed result of the un-inverted read/write select 1126 and the system mode select 1130, which then is NANDed with the global clock 1120. The inverter 1136I inverts the output of the AND-OR-Invert 1136N.

Thus, with reference to the truth table of FIG. 2B, the global clock 1120 passes through to the first local clock 1122 only during a normal read cycle when the system mode select 1130 is validly asserted high, i.e., the ABIST mode select 1128 is held low. Thus, a read address is gated in by this first local clock 1122, which provides both latch timing and input selection. Otherwise, the global clock 1120 only selectively passes through to the second local clock 1124, i.e., only during a normal system write or in an array self test, the global clock 1120 selectively passes through to the second local clock 1124. Further, unless the system mode select 1130 is validly asserted high, the read/write select 1126 is ignored, i.e., a don't care. Thus, a write address or a BIST address is gated in by this second local clock 1124, which provides both latch timing and a partial input selection.

Figure 3:
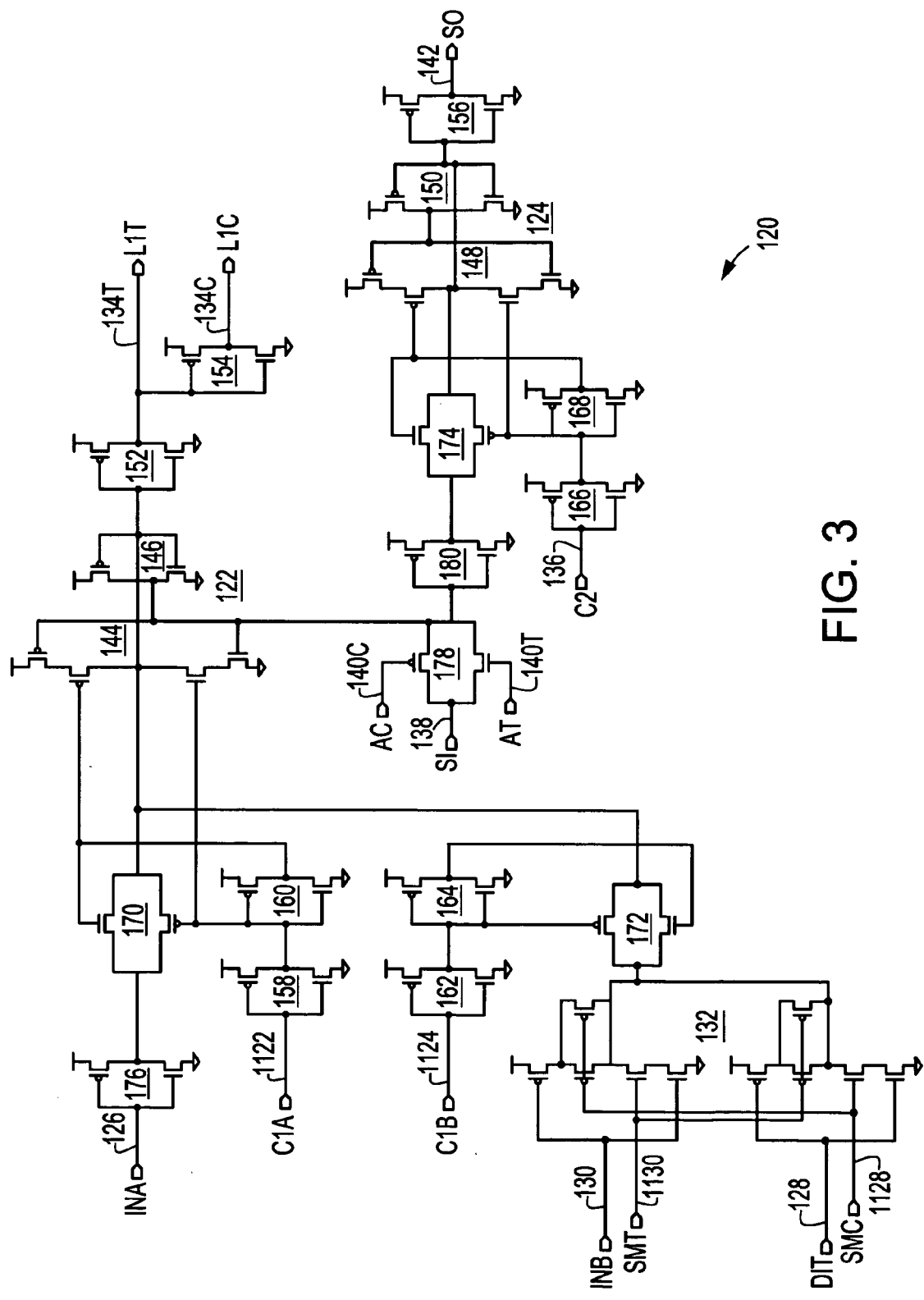
FIG. 3 shows an example of a preferred embodiment multimode boundary latch.

FIG. 3 shows an example of a preferred embodiment multimode boundary latch 120, e.g., for SRAM I/O addresses in a level-sensitive scan design (LSSD) IC. The latch 120 is 2-stage latch and includes a simple latch in each stage, i.e., the L1 stage 122 and the L2 stage 124. A read address bit 126 is gated in by the local read clock 1122 from the preferred multimode clock selector, e.g., 112 in FIG. 2A. Another local clock 1124, selectively gates a test address bit input 128 selected by the ABIST mode select 1128 or a write address bit 130 as selected by the system mode select 1130, in this example in an AND-OR-INVERT 132. The L1 122 stage provides a complementary pair of outputs 134C, 134T. The L2 stage 124 is clocked by an independent global clock 136 and receives a scan input 138, gated by a complementary test select pair (AC, AT) 140C, 140T and provides a single scan out 142. The latch in each of the L1 and L2 stages 122, 124 is a gated cross coupled inverting pair 144, 146 and 148, 150, respectively, one each of which is an inverter 146, 150. The other of the pair is a selectively enabled or gated inverter 144, 148 that is in high impedance (high-Z), when not gated on. A pair of series connected inverters 152, 154 buffer the L1 stage 122 and drive the complementary pair of outputs 130, 132. A single inverter 156 buffers the L2 stage 124 and drives the serial scan out 142.

Each of the local clocks 1122, 1124 and the global test clock 134 pass through a pair of series connected inverters 158, 160, 162, 164, 166, 168, respectively. Each pair of series connected inverters 158, 160, 162, 164, 166, 168, switch (pulse closed) a corresponding CMOS pass gate 170, 172, 174 and, simultaneously, pulse off a corresponding gated inverter 144 and 148 in the L1 and L2 stages 122, 124, allowing data to pass through the respective pass gate 170, 172, 174. CMOS pass gates 170 and 172 are connected together at one end to the enable side of the L1 latch 122, i.e., at the output of selectively enabled inverter 144. The read address bit 126 is the input to inverter 176. The output of inverter 176 is the input to CMOS pass gate 170. The clocked results of the other local clock 124 are connected to one end of pass gate 172. The serial scan input or scan in 138 is connected to one side of another CMOS pass gate 178. The other side of CMOS pass gate 178 is the input to a buffer inverter 180 and the enable side of the L1 stage 122. The buffer inverter 186 drives one end of CMOS pass gate 174 and so, is the input to the L2 stage 124. The other end of CMOS pass gate 174 is connected to the enable side of the L2 latch 124, i.e., at the output of gated inverter 148.

Figure 4:
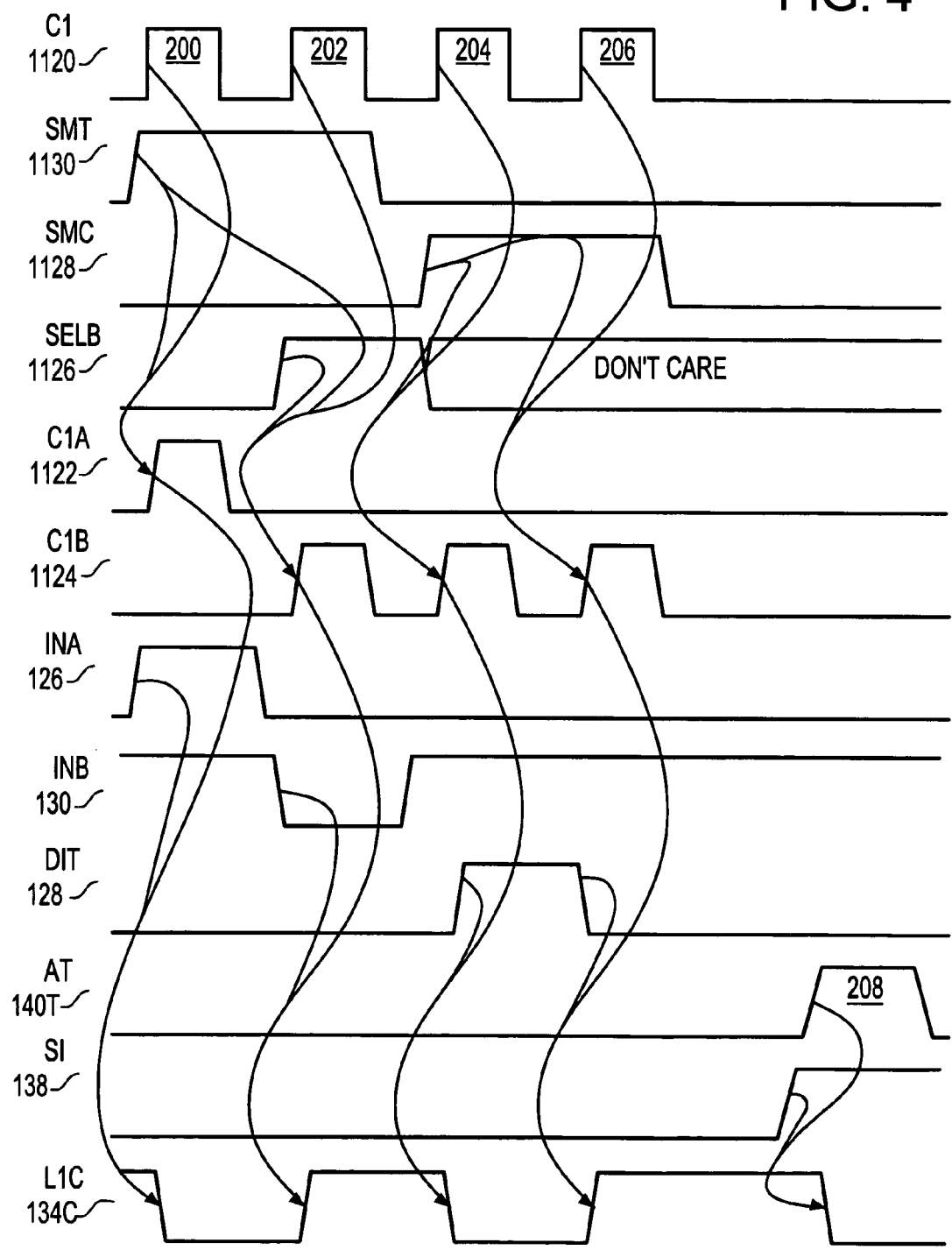
FIG. 4 shows an example of a timing diagram for a preferred embodiment two port SRAM according to a preferred embodiment of the present invention.

FIG. 4 shows an example of a timing diagram for a two port SRAM according to a preferred embodiment of the present invention with reference to the clock driver example 112 of FIG. 2A and the boundary latch example of FIG. 3. First in this example, a read address (INA 126) is presented in global clock period 200, with SMT 1130 high, SELB 1126 low, which gates the global clock C1 1120 through to local read address clock C1A 1122. After some latch propagation delay the read address is latched and presented on both L1 stage outputs to the respective bit decode and word decode as represented by L1C 134C in this example. Next, a write address bit is presented on INB 130 in global clock period 202. Since during the write, SELB 1126 is high; the global clock is gated through to local clock C1B 1124 and the read address clock C1A 1122 remains low. Again, the write address passes out to the respective bit decode and word decode on both L1 stage outputs as represented by L1C 134C. BIST testing begins by dropping SMT 1130 and driving SMC 1128 high. With SMC 1128 high in global clock periods 204 and 206, the global clock is again gated through to local clock C1B 1124, while the read address clock C1A 1122 remains low. In each BIST cycle 204, 206, the test address (DIT 128) passes out to the bit decode and word decode on both L1 stage outputs as represented by L1C 134C. During logic testing both SMC 1128 and SMT 1130 are low and the global clock 1120, which is represented here as remaining low, is ignored (i.e., a don't care). Instead, the complementary test select pair (as represented by AT 140T in 208) gate SI 138 to the L1 stage 122.

Advantageously, a preferred embodiment multi-port SRAM clock driver maintains macro timing reliability in multimode operation regardless of the particular selected mode and address arrival time variation. System, ABIST and LBIST SRAM addresses are selected, latched and launched by race free clock signals.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A multi-port static random access memory (SRAM), said multi-port SRAM comprising:
    an array of SRAM cells arranged in rows of columns;
    a row decode receiving a row address and selecting a corresponding row;
    a column decode receiving a column address and selecting a corresponding column;
    an input port receiving data being written to said array;
    an output port providing data read from said array;
    a plurality of boundary latches receiving read and write addresses and selectively passing a received address to each of said row decode and said column decode; and
    a local clock driver selectively providing clock signals to said boundary latches, said clock signals selecting among received said read and write addresses.

2. A multi-port SRAM as in claim 1, wherein said local clock driver provides a pair of clock signals, one of said pair of clock signals being a read clock signal selectively clocking said plurality of boundary latches, a read address being latched in said plurality of boundary latches by said read clock signal.

3. A multi-port SRAM as in claim 2, wherein said local clock driver comprises an AND gate providing said read clock signal.

4. A multi-port SRAM as in claim 3, wherein said AND gate is a three way AND gate receiving a global clock, a system mode select signal and a read signal.

5. A multi-port SRAM as in claim 4, wherein said local clock driver further comprises an inverter inverting a write signal, the output of said inverter being said read signal.

6. A multi-port SRAM as in claim 2, wherein said local clock driver comprises an AND-OR receiving a global clock (C1), a pair of system mode select signals (SMC, SMT) and a write signal (SELB) and providing a second local clock (C1B).

7. A multi-port SRAM as in claim 6, wherein said AND-OR satisfies C1B=C1 AND (SMC OR (SMT AND SELB)).

8. A multi-port SRAM as in claim 7, wherein said AND-OR comprises an inverter inverting an AND-OR-Invert, said AND-OR-Invert combining C1, SMC, SMT and SELB.

9. A multi-port SRAM as in claim 2, wherein each of said boundary latches comprises:
a first pass gate gated by said read clock signal, one end of said first pass gate being connected to a read address bit input; and
a second pass gate gated by a second of said pair of clock signals, the other end of said first pass gate being connected to one end of said second pass gate and a boundary latch stage input.

10. A multi-port SRAM as in claim 9, further comprising an AND-OR-Invert receiving a write address bit (INB), a pair of system mode select signals (SMC, SMT) and a test address bit (DIT), an output of said AND-OR-Invert connected to the other end of said second pass gate.

11. A multi-port SRAM as in claim 10, wherein said AND-OR-Invert satisfies (INB AND SMC) OR (DIT AND SMT)).

12. A multi-port SRAM as in claim 2, wherein said multi-port SRAM is a two port CMOS SRAM.

13. A CMOS integrated circuit (IC) including a multi-port static random access memory (SRAM), said multi-port SRAM comprising:
an array of SRAM cells arranged in rows of columns;
a row decode receiving a row address and selecting a corresponding row;
a column decode receiving a column address and selecting a corresponding column;
an input port receiving data being written to said array;
an output port providing data read from said array;
a plurality of boundary latches receiving read and write addresses and selectively passing a received address to each of said row decode and said column decode; and
a local clock driver selectively providing a pair of clock signals to said boundary latches, one of said clock signals being a read clock selectively latching a read address bit in each clocked one of said plurality of boundary latches and the other of said pair of clock signals selectively latching a write address bit in said each clocked one.

14. A CMOS IC as in claim 13, wherein said local clock driver comprises a three way AND gate receiving a global clock (C1), a system mode select signal (SMT) and a read signal and providing a local read address clock (CIA).

15. A CMOS IC as in claim 14, wherein said local clock driver further comprises:
an inverter inverting a write signal (SELB), the output of said inverter being said read signal; and
an AND-OR receiving C1, SMT, a second system mode select signal (SMT) and SELB and providing a second local clock (C1B).

16. A CMOS IC as in claim 15, wherein said AND-OR satifies C1B=C1 AND (SMC OR (SMT AND SELB)).

17. A CMOS IC as in claim 16, wherein said AND-OR comprises an inverter inverting an AND-OR-Invert, said AND-OR-Invert combining C1, SMC, SMT and SELB.

18. A CMOS IC as in claim 17, wherein each of said boundary latches comprises:
a first CMOS pass gate gated by said read clock signal, one end of said first CMOS pass gate being connected to a read address bit input (INA); and
a second CMOS pass gate gated by a second of said pair of clock signals, the other end of said first CMOS pass gate being connected to one end of said second CMOS pass gate and a boundary latch stage input.

19. A CMOS IC as in claim 18, further comprising a second AND-OR-Invert receiving a write address bit (INB), SMC, SMT and a test address bit (DIT), an output of said second AND-OR-Invert connected to the other end of said second pass gate.

20. A CMOS IC as in claim 19, wherein said second AND-OR-Invert satisfies (INB AND SMC) OR (DIT AND SMT)).

21. A CMOS IC as in claim 20, wherein each of said boundary latches is a two stage latch and said boundary latch stage input is an input to the first stage, a second stage receiving a scan in selected by a scan select signal, said scan in being coupled to said first stage, said second stage providing a scan out responsive to a global test clock (C2) gating said second stage.

22. A CMOS integrated circuit (IC) including a two port static random access memory (SRAM), said two port SRAM comprising:
an array of SRAM cells arranged in rows of columns;
a row decode receiving a row address and selecting a corresponding row;
a column decode receiving a column address and selecting a corresponding column;
an input port receiving data being written to said array;
an output port providing data read from said array;
a plurality of boundary latches receiving read and write addresses and selectively passing a received address to each of said row decode and said column decode; and
a local clock driver receiving a global clock (C1) and selectively providing a pair of clock signals (C1A, C1B) to said boundary latches, C1A being a read clock selectively latching one read address bit (INA) in each clocked one of said plurality of boundary latches and C1B selectively latching in said each clocked one either of one write address bit (INB) or one test address bit (DIT).

23. A CMOS IC as in claim 22, wherein said local clock driver comprises a three way AND gate ANDing C1, a system mode select signal (SMT) and a read signal and providing C1A.

24. A CMOS IC as in claim 23, wherein SMC is a second system mode select signal provided to said local clock driver and C1B=C1 AND (SMC OR (SMT AND SELB)).

25. A CMOS IC as in claim 24, wherein said local clock driver further comprises:
   an inverter inverting a write signal (SELB), the output of said inverter being said read signal;
   an AND-OR-Invert receiving C1, SMC, SMT and SELB; and
   an inverter receiving an output of said AND-OR-Invert and providing C1B.

26. A CMOS IC as in claim 25, wherein each of said boundary latches comprises:
   a first CMOS pass gate gated by said C1A, INA connected to one end of said first CMOS pass gate;
   a second AND-OR-Invert combining INB, SMC, SMT and DIT; and
   a second CMOS pass gate gated by C1B, an output of said second AND-OR-Invert connected to one end of said second CMOS pass gate, the other end of said first CMOS pass gate being connected to the other end of said second CMOS pass gate and an input to a first stage of a boundary latch.

27. A CMOS IC as in claim 26, wherein said second AND-OR-Invert satisfies (INB AND SMC) OR (DIT AND SMT)).

28. A CMOS IC as in claim 27, wherein each of said boundary latches is a two stage latch comprising a second stage receiving a scan in (SI) selected by a scan select signal, SI being coupled to said first stage, said second stage providing a scan out (SO) responsive to a local clock (C2) gating said second stage.

* * * * *